(12) United States Patent
Soirez et al.

(10) Patent No.: US 12,334,906 B2
(45) Date of Patent: Jun. 17, 2025

(54) MULTI-LAYER RESONATOR ASSEMBLY AND METHOD FOR FABRICATING SAME

(71) Applicant: Raytheon Company, Waltham, MA (US)

(72) Inventors: Lovelace Soirez, Andover, MA (US); Jeffrey R. LaRoche, Andover, MA (US)

(73) Assignee: RAYTHEON COMPANY, Waltham, MA (US)

( * ) Notice: Subject to any disclaimer, the term of this patent is extended or adjusted under 35 U.S.C. 154(b) by 625 days.

(21) Appl. No.: 17/566,144

(22) Filed: Dec. 30, 2021

(65) Prior Publication Data

US 2023/0216480 A1 Jul. 6, 2023

(51) Int. Cl.

| | |
|---|---|
| *H03H 9/17* | (2006.01) |
| *H03H 3/02* | (2006.01) |
| *H10D 30/47* | (2025.01) |
| *H10N 39/00* | (2023.01) |

(52) U.S. Cl.
CPC ............ *H03H 9/178* (2013.01); *H03H 3/02* (2013.01); *H03H 9/173* (2013.01); *H10D 30/475* (2025.01); *H10N 39/00* (2023.02); *H03H 2003/021* (2013.01)

(58) Field of Classification Search
CPC .......... H03H 9/178; H03H 3/02; H03H 9/173; H03H 2003/021; H03H 2003/023; H03H 9/0561; H01L 29/7786; H10N 39/00
See application file for complete search history.

(56) References Cited

U.S. PATENT DOCUMENTS

| | | | |
|---|---|---|---|
| 6,060,818 A | 5/2000 | Ruby | |
| 6,384,697 B1 * | 5/2002 | Ruby | H03H 3/02 333/187 |
| 7,275,292 B2 * | 10/2007 | Ruby | H03H 3/04 29/594 |
| 7,358,831 B2 | 4/2008 | Larson, III | |

(Continued)

FOREIGN PATENT DOCUMENTS

| | | |
|---|---|---|
| CN | 112383286 B | 9/2021 |
| WO | 2021197500 A1 | 10/2021 |

OTHER PUBLICATIONS

International Search Report for PCT/US2022/054347 dated May 22, 2023.

*Primary Examiner* — Aneeta Yodichkas
*Assistant Examiner* — Jose K Abraham
(74) *Attorney, Agent, or Firm* — Getz Balich LLC

(57) ABSTRACT

A method for fabricating a multi-layer resonator assembly includes sequentially fabricating a plurality of vertically-stacked resonator layers including, for each resonator layer of the plurality of resonator layers, depositing a dielectric layer, forming at least one film bulk acoustic resonator (FBAR) cavity in the deposited dielectric layer, filling each FBAR cavity of the at least one FBAR cavity with a sacrificial material block, and depositing a FBAR material stack over the at least one FBAR cavity. The deposited FBAR material stack is in contact with the sacrificial material block and the dielectric layer. The method further includes removing the sacrificial material block from the at least one FBAR cavity for each resonator layer of the plurality of resonator layers subsequent to sequentially fabricating the plurality of resonator layers.

19 Claims, 9 Drawing Sheets

(56) References Cited

U.S. PATENT DOCUMENTS

| | | |
|---|---|---|
| 7,561,009 B2 | 7/2009 | Larson, III |
| 7,562,429 B2 | 7/2009 | Larson, III |
| 7,802,349 B2 * | 9/2010 | Ruby ................ H03H 9/02149 |
| | | 29/25.35 |
| 8,479,363 B2 | 7/2013 | Zhang |
| 2002/0190814 A1 * | 12/2002 | Yamada ............. H03H 9/02102 |
| | | 333/187 |
| 2004/0172798 A1 * | 9/2004 | Ruby ...................... H03H 3/04 |
| | | 29/25.35 |
| 2004/0183399 A1 * | 9/2004 | Nakatani ................ H03H 9/173 |
| | | 310/320 |
| 2005/0034822 A1 * | 2/2005 | Kim ...................... H03H 9/172 |
| | | 159/5 |
| 2010/0327701 A1 * | 12/2010 | Grannen ................ H03H 3/04 |
| | | 29/25.35 |
| 2011/0084779 A1 * | 4/2011 | Zhang .................... H03H 3/02 |
| | | 333/187 |
| 2012/0218059 A1 | 8/2012 | Burak |
| 2017/0264263 A1 * | 9/2017 | Huang .............. H03H 9/02007 |
| 2017/0264264 A1 * | 9/2017 | Huang .................. H03H 9/564 |
| 2017/0264265 A1 * | 9/2017 | Huang ................. H03H 9/1035 |
| 2018/0275485 A1 * | 9/2018 | Hurwitz ................. H03H 9/605 |
| 2019/0229705 A1 | 7/2019 | Dasgupta |
| 2019/0245509 A1 * | 8/2019 | Hurwitz ............ H03H 9/02031 |
| 2020/0099365 A1 | 3/2020 | Choy |

* cited by examiner

MULTI-LAYER RESONATOR ASSEMBLY AND METHOD FOR FABRICATING SAME

BACKGROUND

1. Technical Field

This disclosure relates generally to radio frequency (RF) filters, and more particularly to multi-layer resonator assemblies which include film bulk acoustic resonators (FBARs).

2. Background Information

In many radio frequency (RF) applications, electrical resonators are used in filters to condition signals and improve transmission. Despite the continued drive to reduce electrical component size and footprint, many known filter technologies do not easily lend themselves to miniaturization. Piezoelectric-based resonators have acoustic resonant modes generated in the piezoelectric material, and these acoustic waves are converted into electrical waves for use in electrical applications.

One type of piezoelectric resonator, the film bulk acoustic resonator (FBAR), has a small footprint and can be incorporated into integrated circuit (IC) manufacturing processes. As shown in FIGS. 1A-C, the FBAR 100 is an acoustic material stack which may include a piezoelectric material layer 102 sandwiched between two electrodes 104. The FBAR 100 is formed on a substrate 106 with the electrodes 104 and a portion of the piezoelectric material 102 suspended over an air gap 108 (e.g., a cavity). Acoustic waves achieve resonance across the acoustic material stack, with a particular resonant frequency determined by the layer materials as well as the electrode 104 shape.

However, high-density FBAR filter networks can be difficult to fabricate, especially at the small form factors needed in today's most advanced RF systems. For example, it can be difficult to fabricate multi-level FBAR architectures which include FBARs and associated cavities at multiple levels (e.g., layers) within the same chip. There is a need in the art, therefore, for improved resonator assemblies and associated fabrication methods.

SUMMARY

It should be understood that any or all of the features or embodiments described herein can be used or combined in any combination with each and every other feature or embodiment described herein unless expressly noted otherwise.

According to an aspect of the present disclosure, a method for fabricating a multi-layer resonator assembly includes sequentially fabricating a plurality of vertically-stacked resonator layers including, for each resonator layer of the plurality of resonator layers, depositing a dielectric layer, forming at least one film bulk acoustic resonator (FBAR) cavity in the deposited dielectric layer, filling each FBAR cavity of the at least one FBAR cavity with a sacrificial material block, and depositing a FBAR material stack over the at least one FBAR cavity. The deposited FBAR material stack is in contact with the sacrificial material block and the dielectric layer. The method further includes removing the sacrificial material block from the at least one FBAR cavity for each resonator layer of the plurality of resonator layers subsequent to sequentially fabricating the plurality of resonator layers.

In any of the aspects or embodiments described above and herein, the step of filling the at least one FBAR cavity with a sacrificial material block may include depositing the sacrificial material block using one of chemical vapor deposition, physical vapor deposition, or atomic layer deposition.

In any of the aspects or embodiments described above and herein, the step of removing the sacrificial material block the at least one FBAR cavity for each resonator layer of the plurality of resonator layers may include exposing the plurality of resonator layers to one of xenon difluoride ($XeF_2$), potassium hydroxide (KOH), hydrogen peroxide ($H_2O_2$), or oxygen ($O_2$) plasma.

In any of the aspects or embodiments described above and herein, subsequent to fabricating the plurality of resonator layers and prior to removing the sacrificial material block from the at least one FBAR cavity for each resonator layer of the plurality of resonator layers, the sacrificial material block for the at least one FBAR cavity for each resonator layer of the plurality of resonator layers may be in contact with a vertically-adjacent sacrificial material block located within a vertically adjacent resonator layer of the plurality of resonator layers.

In any of the aspects or embodiments described above and herein, the method may further include, for each resonator layer of the plurality of resonator layers, planarizing the dielectric layer and the sacrificial material block within each FBAR cavity of the at least one FBAR cavity subsequent to the step of filling each FBAR cavity of the at least one FBAR cavity with a sacrificial material block.

In any of the aspects or embodiments described above and herein, the method may further include, for each resonator layer of the plurality of resonator layers, forming one or more conductive layers in the dielectric layer.

In any of the aspects or embodiments described above and herein, the method may further include, for each resonator layer of the plurality of resonator layers, depositing a dielectric coating on the dielectric layer and the sacrificial material block within each FBAR cavity of the at least one FBAR cavity subsequent to the step of filling each FBAR cavity of the at least one FBAR cavity with a sacrificial material block and prior to the step of depositing the FBAR material stack over the at least one FBAR cavity.

In any of the aspects or embodiments described above and herein, the method may further include, for each resonator layer of the plurality of resonator layers, removing one or more portions of the dielectric coating prior to the step of depositing the FBAR material stack over the at least one FBAR cavity.

In any of the aspects or embodiments described above and herein, the deposited FBAR material stack may include a piezoelectric layer and at least one conductive layer.

In any of the aspects or embodiments described above and herein, the piezoelectric layer may be sandwiched between a top conductive layer of the at least one conductive layer and a bottom conductive layer of the at least one conductive layer In any of the aspects or embodiments described above and herein, the sacrificial material block may include one of amorphous silicon, polycrystalline silicon, tungsten, titanium nitride (TiN), or polyimide.

According to another aspect of the present disclosure, a multi-layer resonator assembly includes a plurality of vertically-stacked resonator layers including a plurality of film bulk acoustic resonators (FBARs). Each resonator layer of the plurality of resonator layers includes a dielectric layer having a top surface and a bottom surface. The dielectric layer defines at least FBAR cavity within the dielectric layer.

The at least one FBAR cavity extends from the top surface to the bottom surface. Each resonator layer of the plurality of resonator layers further includes at least one FBAR of the plurality of FBARs disposed on the top surface of the dielectric layer. Each FBAR of the at least one FBAR extends across an FBAR cavity of the at least one FBAR cavity. Each FBAR cavity of the at least one FBAR cavity of each resonator layer of the plurality of layers is vertically aligned with a respective FBAR cavity of the at least one FBAR cavity for each vertically adjacent resonator layer of the plurality of resonator layers.

In any of the aspects or embodiments described above and herein, the multi-layer resonator assembly may further include a plurality of sacrificial material blocks with each sacrificial material block of the plurality of sacrificial material blocks disposed in a respective FBAR cavity of the at least one FBAR cavity for each resonator layer of the plurality of resonator layers.

In any of the aspects or embodiments described above and herein, each sacrificial material block of the plurality of sacrificial material blocks may be in contact with a vertically-adjacent sacrificial material block of the plurality of sacrificial material blocks for each vertically adjacent resonator layer of the plurality of resonator layers.

In any of the aspects or embodiments described above and herein, the plurality of sacrificial material blocks may include one of amorphous silicon, polycrystalline silicon, tungsten, titanium nitride (TiN), or polyimide.

In any of the aspects or embodiments described above and herein, at least a portion of FBARs of the plurality of FBARs may be electrically connected to one another in a ladder configuration. The portion of FBARs includes a first sub-portion of FBARs which may be located in a first resonator layer of the plurality of resonator layers and a second sub-portion of FBARs which may be located in a second resonator layer of the plurality of resonator layers vertically adjacent the first resonator layer.

In any of the aspects or embodiments described above and herein, at least a portion of FBARs of the plurality of FBARs may be electrically connected to one another in a lattice configuration. The portion of FBARs includes a first sub-portion of FBARs which may be located in a first resonator layer of the plurality of resonator layers and a second sub-portion of FBARs which may be located in a second resonator layer of the plurality of resonator layers vertically adjacent the first resonator layer.

In any of the aspects or embodiments described above and herein, at least a portion of FBARs of the plurality of FBARs may be electrically connected to one another in a ladder-lattice configuration. The portion of FBARs includes a first sub-portion of FBARs which may be located in a first resonator layer of the plurality of resonator layers, a second sub-portion of FBARs which may be located in a second resonator layer of the plurality of resonator layers vertically adjacent the first resonator layer, and a third sub-portion of FBARs which may be located in a third resonator layer of the plurality of resonator layers vertically adjacent the second resonator layer.

In any of the aspects or embodiments described above and herein, one or more FBARs of the plurality of FBARs may include a piezoelectric layer sandwiched between a top conductive layer and a bottom conductive layer.

In any of the aspects or embodiments described above and herein, the multi-layer resonator assembly may further include a base layer positioned vertically adjacent the plurality of resonator layers. The base layer may include a high-electron-mobility transistor (HEMT).

The present disclosure, and all its aspects, embodiments and advantages associated therewith will become more readily apparent in view of the detailed description provided below, including the accompanying drawings.

DETAILED DESCRIPTION

Figure 1A:
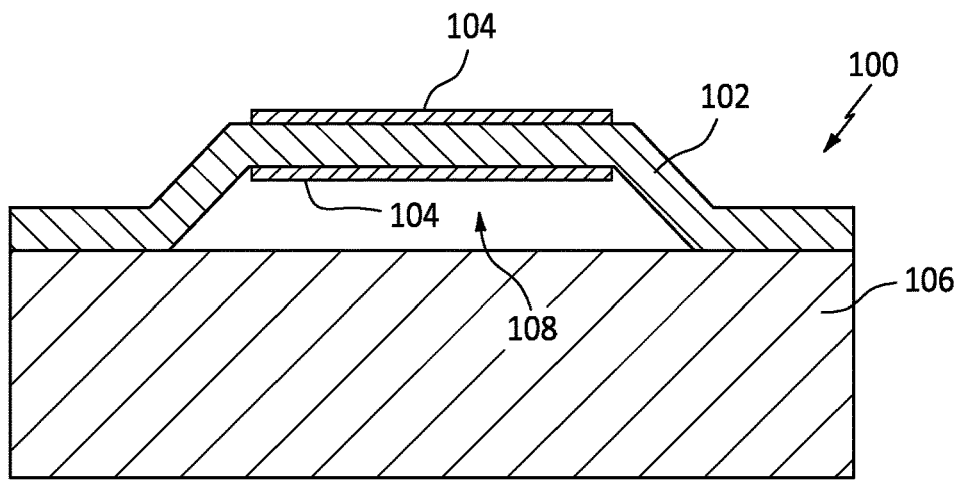
FIGS. 1A-C illustrate cross-sectional views of exemplary film bulk acoustic resonators (FBARs) mounted to a substrate.
Figure 1B:
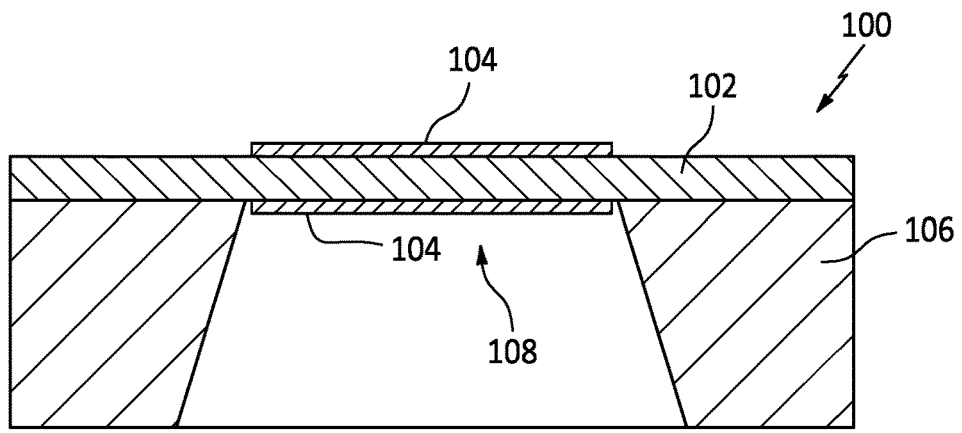
Figure 1C:
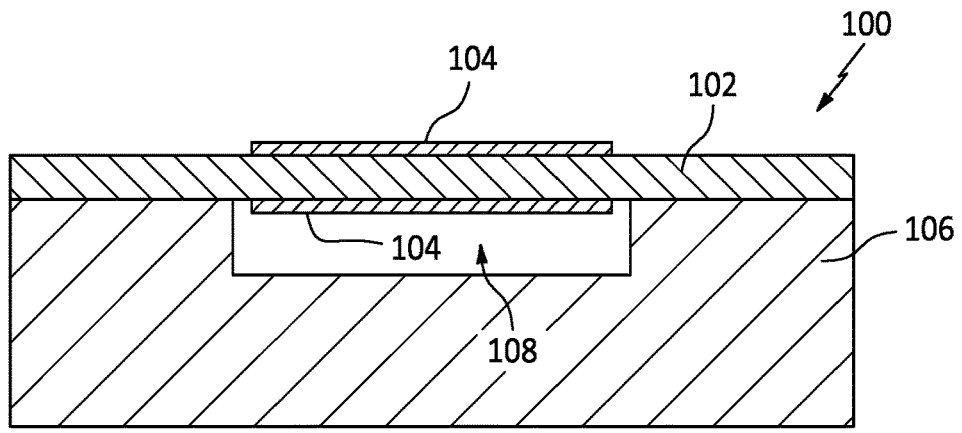
Figure 2:
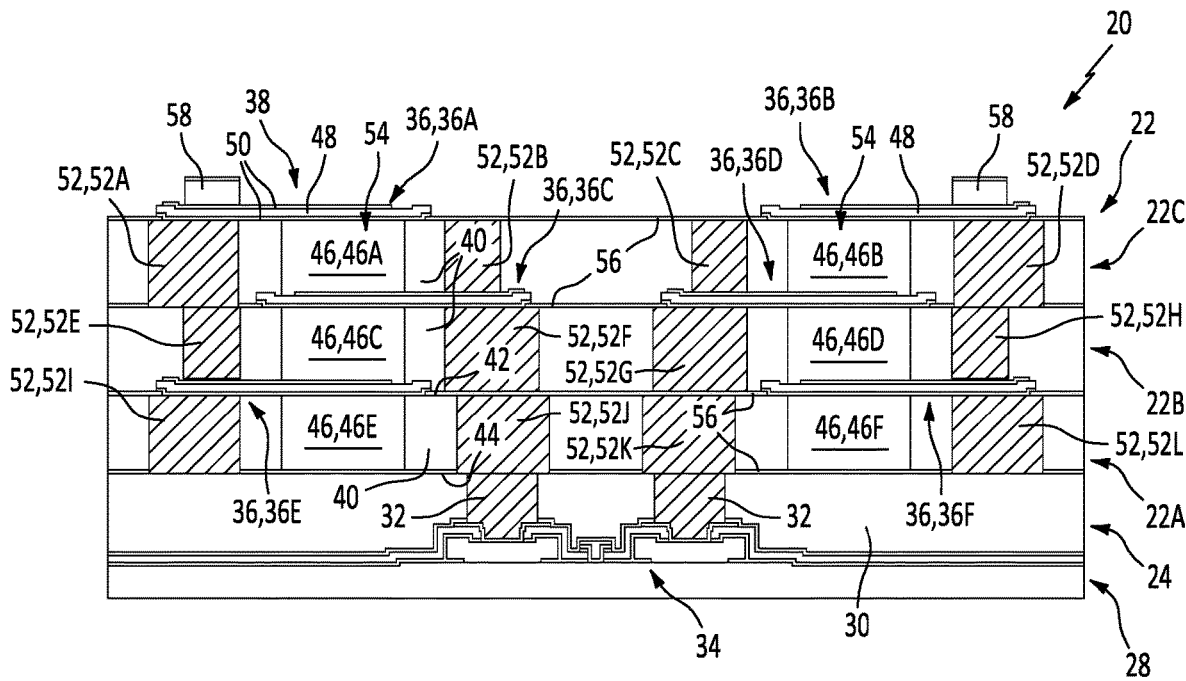
FIG. 2 illustrates a side cutaway view of a portion of a multi-layer resonator assembly, in accordance with one or more embodiments of the present disclosure.
Figure 3:
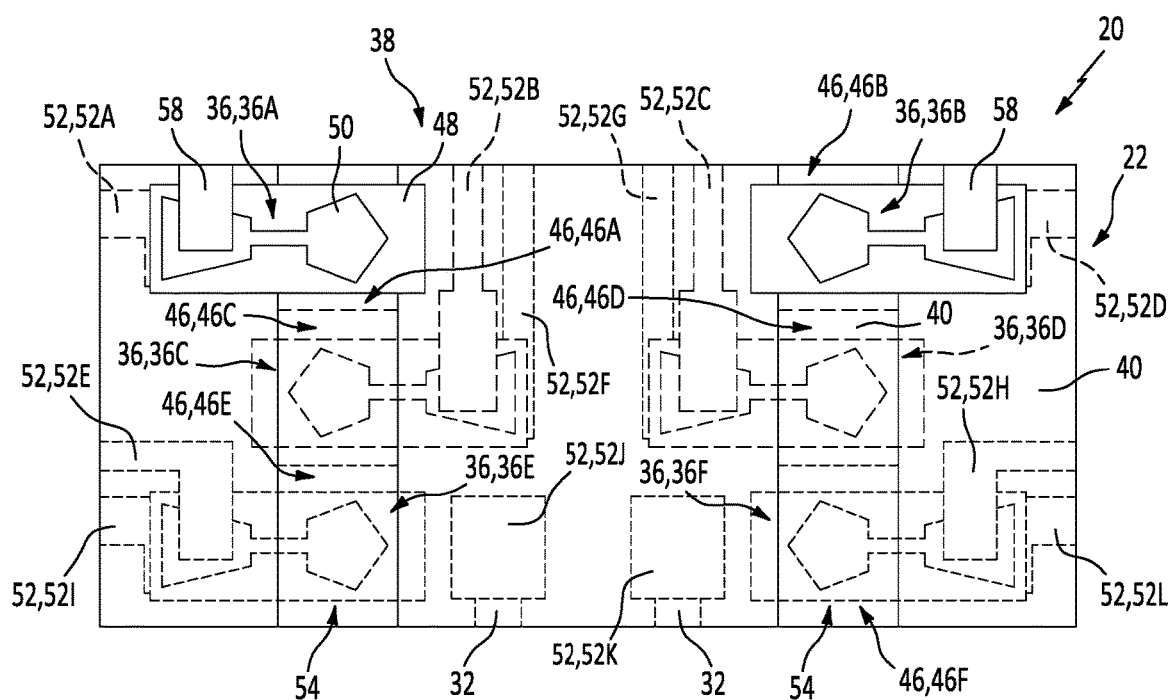
FIG. 3 illustrates a top cutaway view of the portion of the multi-layer resonator assembly of FIG. 2, in accordance with one or more embodiments of the present disclosure.

Referring to FIGS. 2 and 3, a multi-layer resonator assembly 20 (hereinafter "resonator assembly 20") according to the present disclosure includes a plurality of vertically-stacked resonator layers 22 configured as an integrated circuit (IC). In some embodiments, the resonator assembly 20 may further include a base layer 24 vertically adjacent the plurality of resonator layers 22. FIGS. 2 and 3 illustrate a portion of an exemplary resonator assembly 20 including the base layer 24 and three resonator layers 22. It should be understood, however, that the present disclosure is not limited to the particular configuration of the resonator assembly 20 illustrated in FIGS. 2 and 3 and is not limited to any particular number of resonator layers 22. As used here, the terms "vertical" or "vertically" refer to a direction generally orthogonal to a primary surface relative to which the resonator assembly 20 is processed during fabrication and which may be considered to define a generally horizontal direction.

The base layer 24 may be an initial layer of an integrated circuit and may be formed on a bare substrate wafer 28, as shown in FIG. 2. Alternatively, the base layer 24 may be a final layer of a more complex IC such as, for example, a gallium nitride (GaN) switch network. The base layer 24 may generally include a dielectric layer 30, conductor layers 32, and input/output circuitry 34. Other passive structures such as, for example, capacitors and inductors, may also be included in the base layer 24. In some embodiments, the base layer 24 may include GaN high-electron-mobility transistors (HEMTs), as well as accompanying IC structures. In some embodiments, incorporation of GaN HEMT circuitry into the resonator assembly 20 may be accomplished through formation of the plurality of resonator layers 22 directly on top of GaN HEMT circuitry.

The plurality of resonator layers 22 include a plurality of film bulk acoustic resonators (FBARs) 36 which are electrically connected to form at least one filter network 38. In some embodiments, the filter network 38 may be configured as a three-dimensional (e.g., multi-layer) array of FBARs of the plurality of FBARs 36, as will be discussed in further detail. Each resonator layer 22 includes a dielectric layer 40 and at least one FBAR 36 of the plurality of FBARs 36. The dielectric layer 40 has a top surface 42 and a bottom surface 44 opposite the top surface 42. The dielectric layer 40 as well as the dielectric layer 30 may be made from a suitable dielectric material such as silicon nitride (e.g., SiN or $Si_3N_4$), silicon dioxide ($SiO_2$), and the like. The dielectric layer 40 includes at least one FBAR cavity 46 extending vertically through the dielectric layer 40 from the top surface 42 to the bottom surface 44. Each FBAR 36 for each resonator layer 22 of the plurality of resonator layers 22 is positioned such that each FBAR 36 extends across an FBAR cavity 46 disposed in the respective resonator layer 22. At least a portion of each FBAR 36 for each resonator layer 22 of the plurality of resonator layers 22 may be in contact with the top surface 42 of the dielectric layer 40 for the respective resonator layer 22.

Each FBAR 36 of the plurality of FBARs 36 generally includes a piezoelectric layer 48 and at least one conductive layer 50 (e.g., an electrode). In some embodiments, one or more FBARs 36 of the plurality of FBARs 36 may be configured with the piezoelectric layer 48 sandwiched between two conductive layers 50 (e.g., a top conductive layer and a bottom conductive layer) as shown, for example, in FIG. 2. In some embodiments, one or more FBARs 36 of the plurality of FBARs 36 may have a "top-electrode-only" configuration in which the respective FBAR 36 includes a top conductive layer 50 on top of the piezoelectric layer 48 with no conductive layer on the bottom of the piezoelectric layer 48. In some embodiments, the top conductive layer 50 may be patterned lithographically in order to target specific resonant frequencies or other performance requirements for the respective FBAR 36. Non-limiting examples of piezoelectric layer 48 materials include, but are not limited to, aluminum nitride (AlN), scandium-doped aluminum nitride (ScAlN), gallium nitride (GaN), zinc oxide (ZnO), and the like. The at least one conductive layer 50 may typically be made from a metal material. Non-limiting examples of conductive layer 50 materials include, but are not limited to, aluminum (Al) or molybdenum (Mo). The plurality of FBARs 36 may include FBARs 36 having different thicknesses, sizes, shapes, and configurations depending, for example, on the desired frequency ranges to be filtered.

Each resonator layer 22 of the plurality of resonator layers 22 further includes conductive layers 52 configured for electrically connecting components of the resonator assembly 20 including the plurality of FBARs 36. As shown in FIG. 2, the conductive layers 52 including in on resonator layer 22 of the plurality of resonator layers 22 may be in electrical contact with conductive layers 52 in a vertically-adjacent resonator layer 22 of the plurality of resonator layers 22. The conductive layers 52 may generally be made from a metal material such as, for example, copper (Cu) (e.g., copper damascene), aluminum (Al), or the like.

As shown in FIGS. 2 and 3, each FBAR cavities 46 of each resonator layer 22 is vertically aligned with one or more FBAR cavities 46 in each vertically-adjacent resonator layer 22 of the plurality of resonator layers 22. In other words, at least a portion of each FBAR cavity 46 is vertically aligned with at least a portion of a vertically-adjacent FBAR cavity 46 located within a vertically-adjacent resonator layer 22. As such, the at least one FBAR cavity 46 associated with each resonator layer 22 of the plurality of resonator layers 22 may, in combination, define one or more continuous etching passages 54 extending through the plurality of resonator layers 22, for example, from a vertically-outermost resonator layer 22 to a vertically-innermost resonator layer 22. As shown in FIG. 3, the one or more FBAR cavities 46 of each resonator layer 22 may be horizontally staggered (e.g., offset) from the one or more FBAR cavities 46 of vertically-adjacent resonator layers 22 of the plurality of resonator layers 22.

The resonator assembly 20 may include a thin capping dielectric coating 56 (hereinafter "dielectric coating 56") disposed between vertically-adjacent resonator layers 22 of the plurality of resonator layers 22 as well as between the base layer 24 and a vertically-adjacent resonator layer 22 of the plurality of resonator layers 22. The dielectric coating 56 may be made from a suitable dielectric material such as silicon nitride (e.g., SiN or $Si_3N_4$) and the like, to electrically isolate components (e.g., conductive layers 52) of each resonator layer 22 from components of vertically-adjacent resonator layers 22 of the plurality of resonator layers 22. Portions of the dielectric coating 56 may be removed, for example, to allow positioning of resonator assembly 20 components (e.g., the plurality of FBARs 36), electrical contact between vertically adjacent components (e.g., conductive layers 52), etc. The resonator assembly 20 may further include one or more pad out structure 58 in electrical contact with one or more of the FBARs 36 of the plurality of FBARs 36.

FIGS. 2 and 3 illustrate partial cutaway views of a portion of an exemplary resonator assembly 20, as previously discussed, having the plurality of FBARs 36 arranged as a multi-layer array of FBARs. In particular, FIG. 2 illustrates a side view of the exemplary resonator assembly 20 while FIG. 3 illustrates a top view of the resonator assembly 20 of FIG. 2. The plurality of resonator layers 22 are indicated in FIG. 2 as a first resonator layer 22A, a second resonator layer 22B, and a third resonator layer 22C. For ease of understanding, FIGS. 2 and 3 illustrate the plurality of FBARs 36 as FBARs 36A-F, the FBAR cavities 46 as FBAR cavities 46A-F, and the conductive layers 52 as conductive layers 52A-L.

Figure 4:
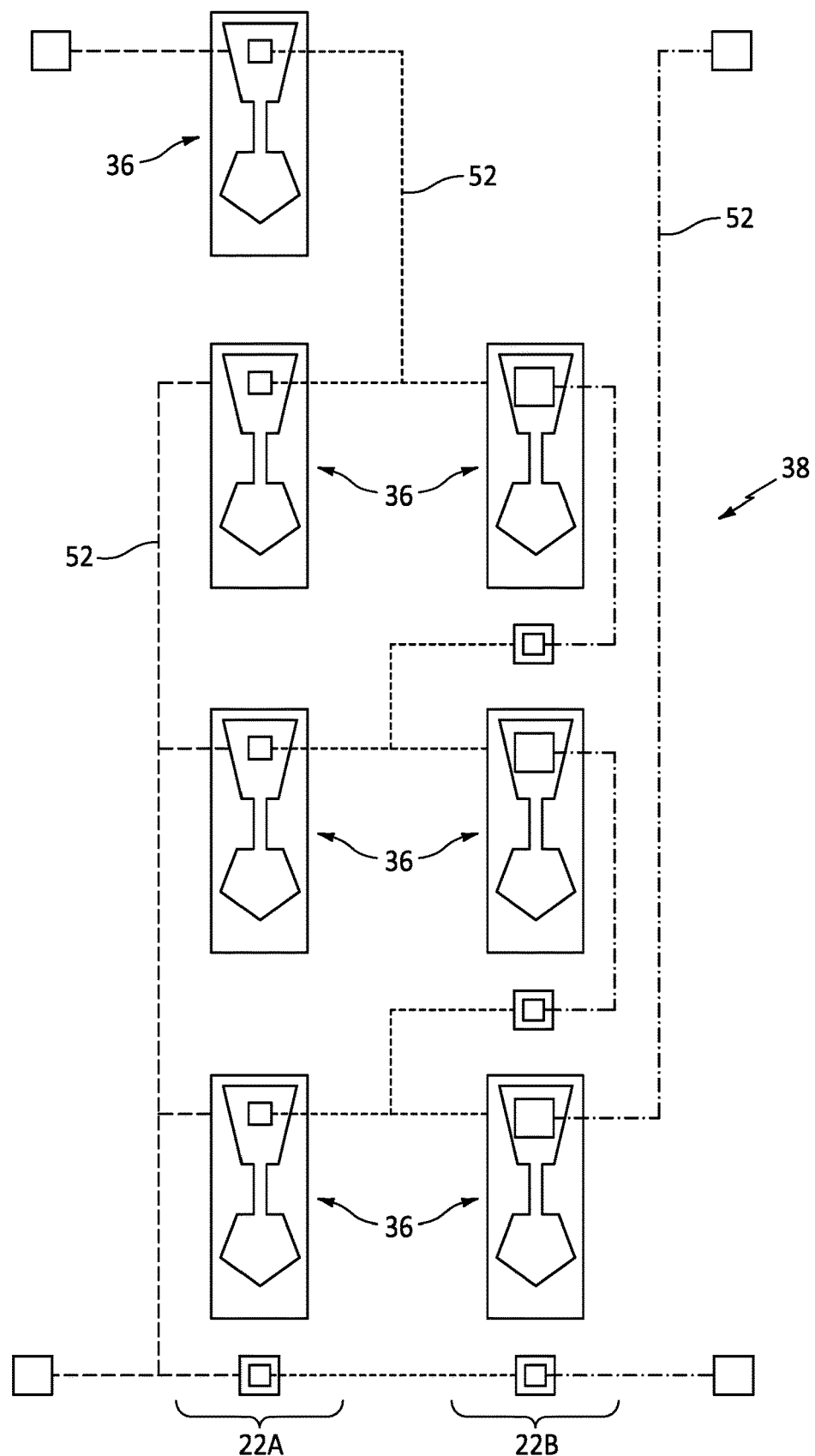
FIG. 4 illustrates a schematic view of FBARs electrically connected in a ladder configuration, in accordance with one or more embodiments of the present disclosure.
Figure 5:
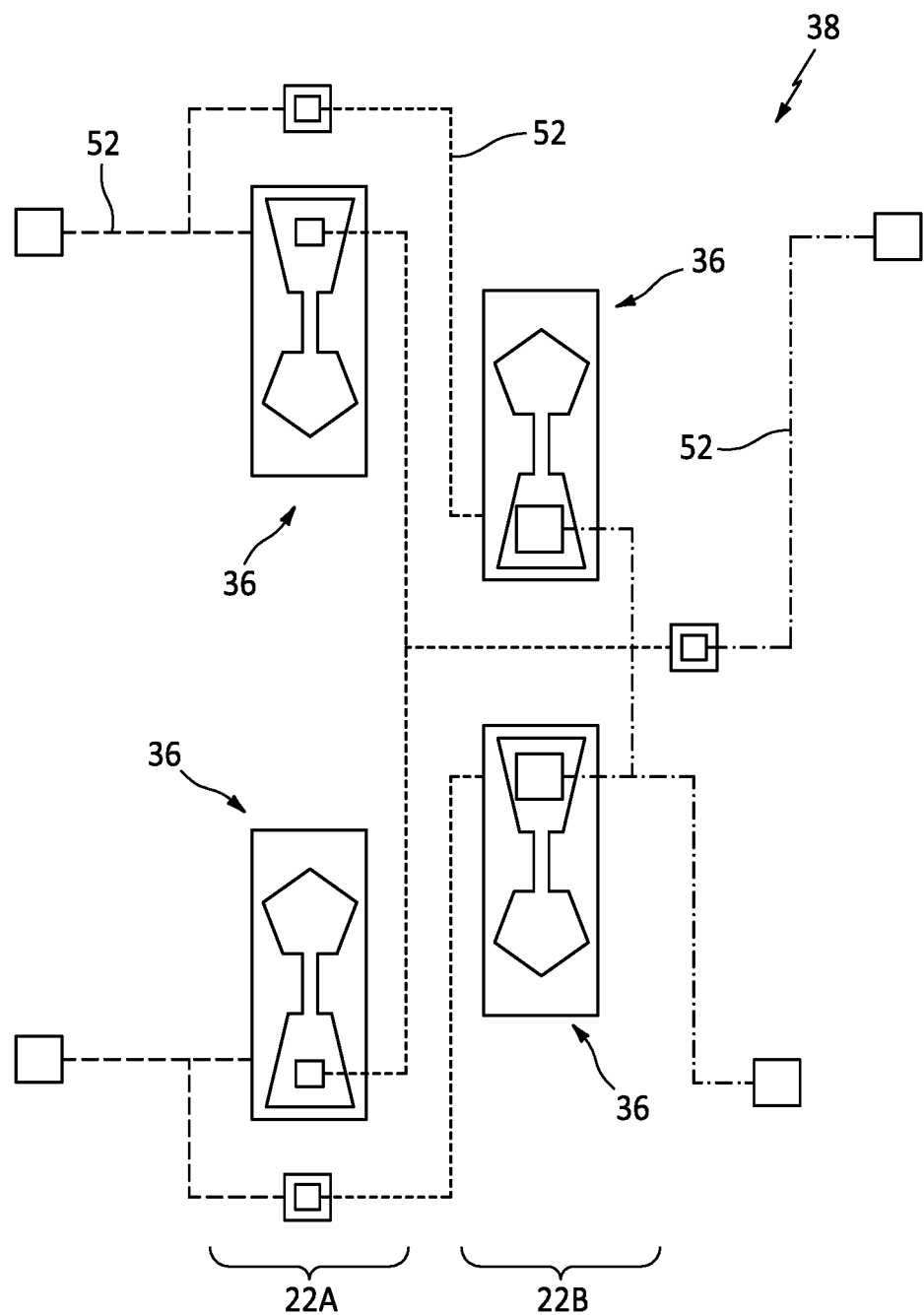
FIG. 5 illustrates a schematic view of FBARs electrically connected in a lattice configuration, in accordance with one or more embodiments of the present disclosure.
Figure 6:
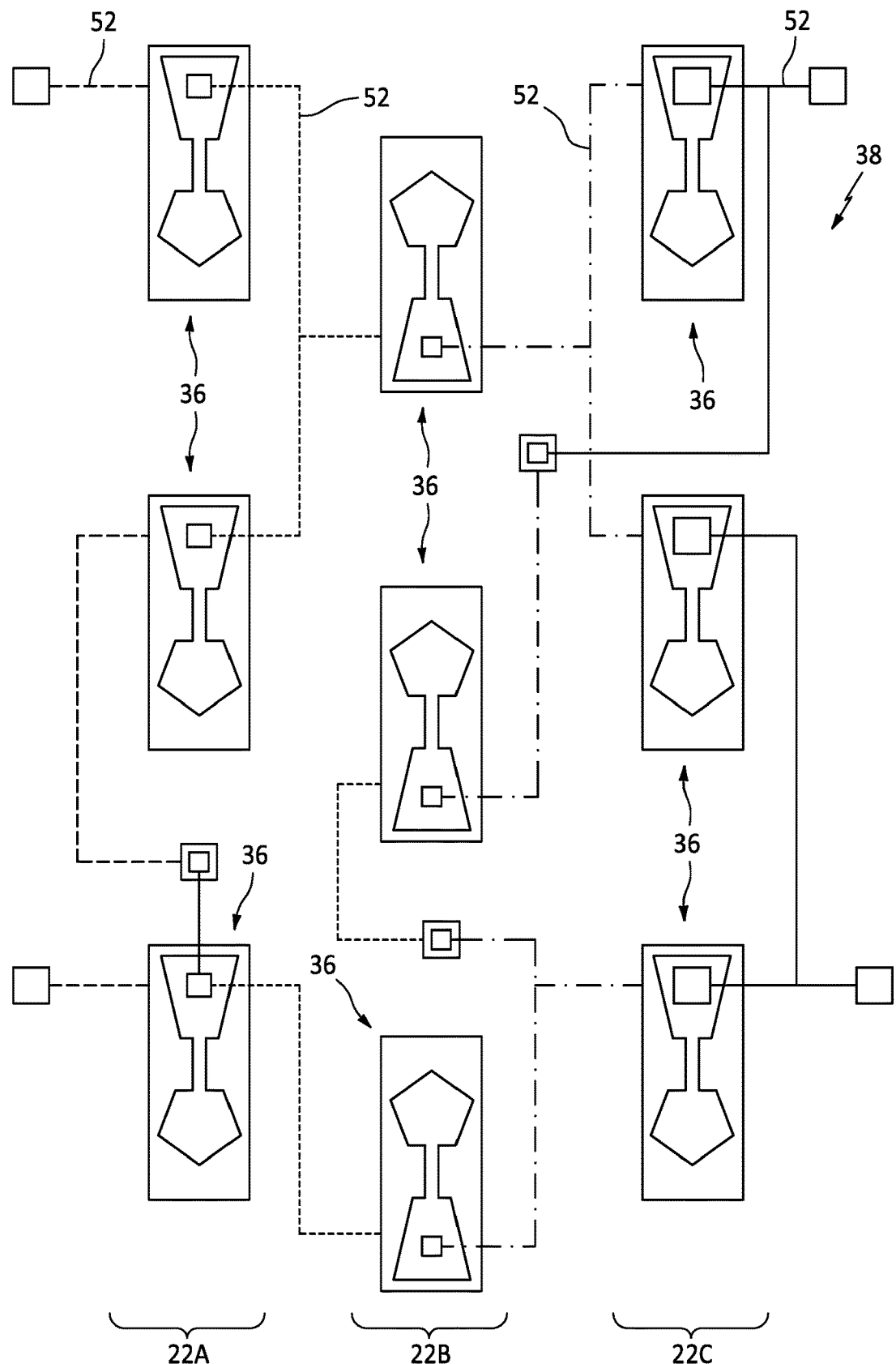
FIG. 6 illustrates a schematic view of FBARs electrically connected in a ladder-lattice configuration, in accordance with one or more embodiments of the present disclosure.

Referring now to FIGS. 4-6, the plurality of FBARs 36 may be electrically connected with the conductive layers 52 to form one or more multi-layer filter networks 38. As shown in FIGS. 4-6, conductive layers 52 disposed within a first resonator layer 22 of the plurality of resonator layers 22 are schematically illustrated with a dashed line, conductive layers 52 disposed within a second resonator layer 22 of the plurality of resonator layers 22 are schematically illustrated with a dotted line, conductive layers 52 disposed within a third resonator layer 22 of the plurality of resonator layers 22 are schematically illustrated with a dashed-dotted line, and conductive layers 52 disposed within a fourth resonator layer 22 of the plurality of resonator layers 22 are schematically illustrated with a solid line. The FBAR configurations of FIGS. 4-6 are included to illustrate the multi-layer configuration of the filter networks 38 and the present disclosure filter networks 38 are not limited to the FBAR configurations illustrated in FIGS. 4-6.

As shown in FIG. 4, at least a portion of FBARs 36 of the plurality of FBARs 36 may be electrically connected to one another in a "ladder configuration." A first sub-portion of the FBARs 36 may be located in a first resonator layer 22A of the plurality of resonator layers 22 while a second sub-portion of the FBARs 36 may be located in a second resonator layer 22B of the plurality of resonator layers 22. The first resonator layer 22A may be positioned vertically adjacent the second resonator layer 22B of the plurality of resonator layers 22.

As shown in FIG. 5, at least a portion of FBARs 36 of the plurality of FBARs 36 may be electrically connected to one another in a "lattice configuration." A first sub-portion of the FBARs 36 may be located in a first resonator layer 22A of the plurality of resonator layers 22 while a second sub-portion of the FBARs 36 may be located in a second resonator layer 22B of the plurality of resonator layers 22. The first resonator layer 22A may be positioned vertically adjacent the second resonator layer 22B of the plurality of resonator layers 22.

As shown in FIG. 6, at least a portion of FBARs 36 of the plurality of FBARs 36 may be electrically connected to one another in a "ladder-lattice configuration." A first sub-portion of the FBARs 36 may be located in a first resonator layer 22A of the plurality of resonator layers 22, a second sub-portion of the FBARs 36 may be located in a second resonator layer 22B of the plurality of resonator layers 22, and a third sub-portion of the FBARs 36 may be located in a third resonator layer 22C of the plurality of resonator layers 22. The first resonator layer 22A, the second resonator layer 22B, and/or the third resonator layer 22C may be located vertically adjacent another of the first resonator layer 22A, the second resonator layer 22B, and the third resonator layer 22C.

Figure 7:
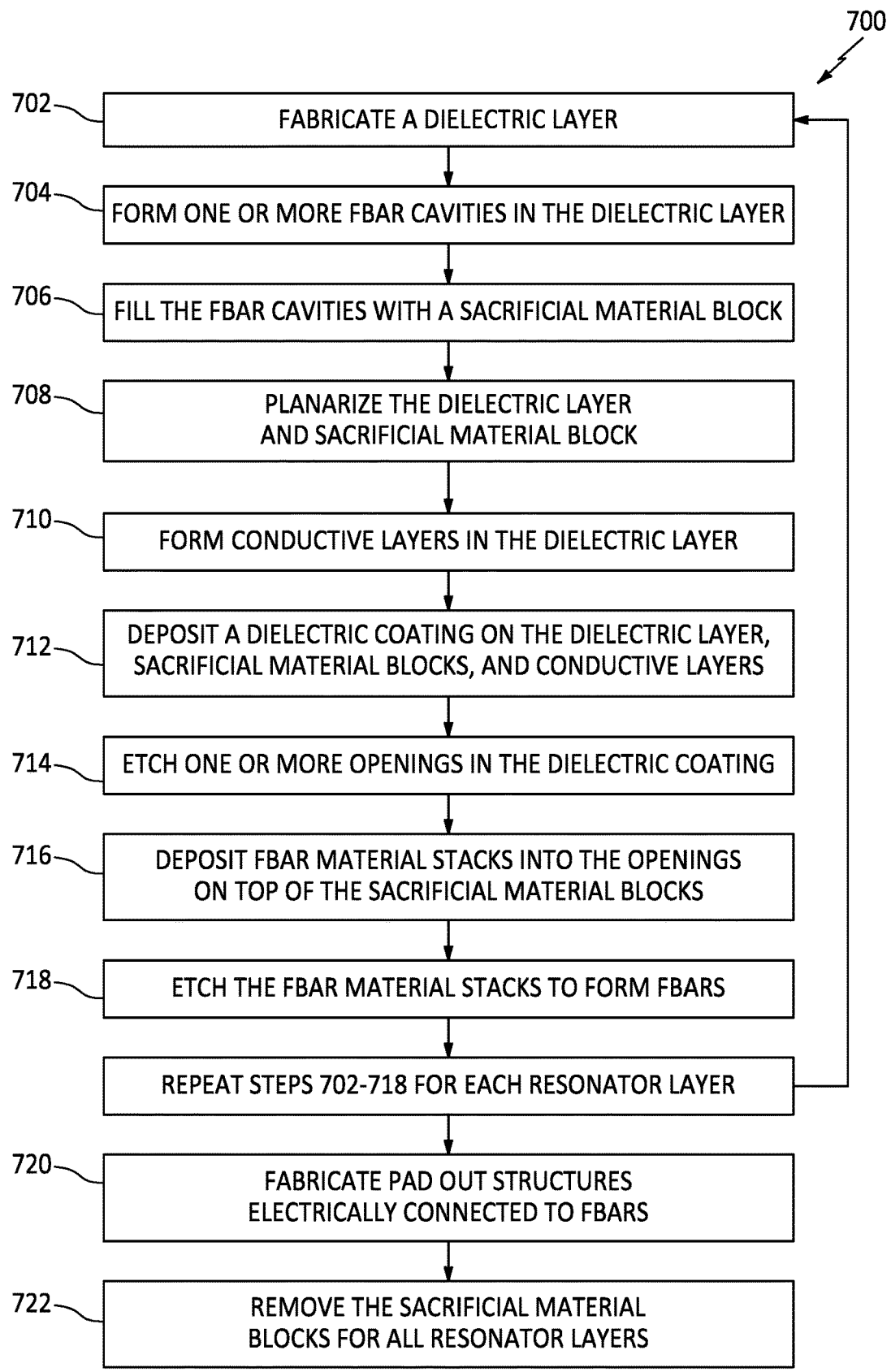
FIG. 7 illustrates a flow chart for a method for forming a multi-layer resonator assembly, in accordance with one or more embodiments of the present disclosure.

FIG. 7 illustrates a flow chart of a method 700 for fabricating a multi-layer resonator assembly such as, but not limited to, the resonator assembly 20. Various steps of the method 700 are described with reference to the side cutaway views of FIGS. 8A-H which illustrate portions of the resonator assembly 20 at various stages of formation.

Figure 8A:
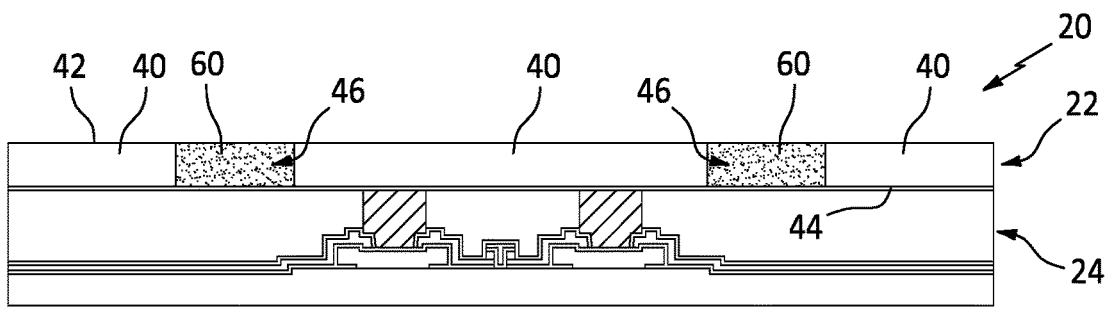
FIGS. 8A-H illustrate a sequence of side cutaway views of a portion of a multi-layer resonator assembly at various stages of formation, in accordance with one or more embodiments of the present disclosure.

In step 702, the dielectric layer 40 for a resonator layer 22 is deposited. The dielectric layer 40 for an initial resonator layer 22 of the plurality of resonator layers 22 may be deposited or otherwise positioned onto the substrate 28 or onto the base layer 24, as shown in FIG. 8A. In some embodiments, step 702 may include planarizing the dielectric layer 40 to define a substantially planar top surface 42 of the dielectric layer 40. The dielectric layer 40 may be planarized using a chemical-mechanical polishing (CMP) method or other suitable IC planarizing method.

In step 704, the one or more FBAR cavities 46 are formed in the dielectric layer 40 by removing dielectric material from the dielectric layer 40. For example, the dielectric layer 40 may be etched using a suitable wet etching or dry etching (e.g., plasma etching) process. In step 706, the formed FBAR cavities 46 are filled with a sacrificial material block 60, as shown in FIG. 8A. The sacrificial material block 60 may fill each FBAR cavity 46 and may extend between the bottom surface 44 and the top surface 42 of the dielectric layer 40. The sacrificial material block 60 may be deposited in the FBAR cavities 46 by, for example, chemical vapor deposition (CVD), physical vapor deposition (PVD), atomic layer deposition (ALD), or the like. Non-limiting examples of sacrificial material block 60 material may include amorphous silicon, polycrystalline silicon, tungsten, titanium nitride (TiN), or polyimide.

In step 708, the sacrificial material block 60 deposited in each FBAR cavity 46 may be planarized to be level with the surrounding dielectric layer 40 (e.g., the top surface 42 of the dielectric layer 40). In some embodiments, the dielectric layer 40 may alternatively be planarized coincident with planarizing of the sacrificial material blocks 60 in step 708. The sacrificial material blocks 60 may be planarized using a chemical-mechanical polishing (CMP) method or other suitable IC planarizing method.

Figure 8B:
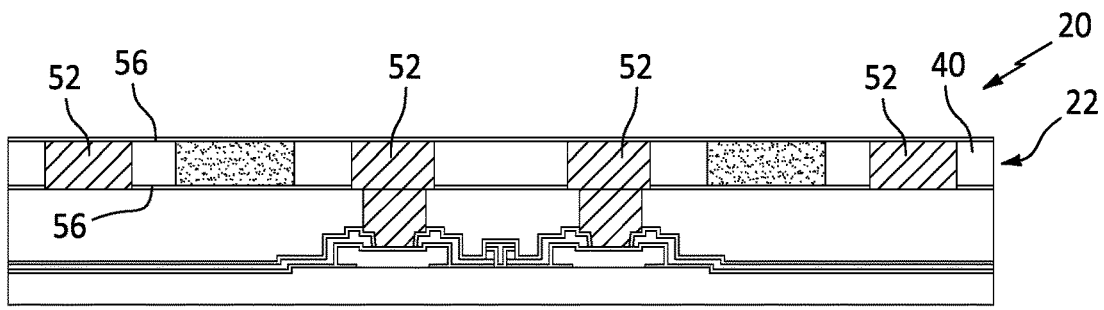

In step 710, the conductive layers 52 are formed in the dielectric layer 40, as shown in FIG. 8B. Forming the conductive layers 52 may first include etching the dielectric layer 40 to form channels within which the conductive material of the conductive layers 52 may be deposited. Forming the conductive layers 52 may further include etching one or more portions of the dielectric coating 56 for a preceding vertically-adjacent resonator layer 22 to position the conductive layers 52 in electrical contact with one or more conductive layers 52 in the preceding vertically-adjacent resonator layer 22. In step 712, the dielectric layer 40, the conductive layers 52, and the sacrificial material blocks 60 are capped with the dielectric coating 56, as shown in FIG. 8B. In step 714, one or more portions of the dielectric coating 56 may be etched to form at least one FBAR opening 62 within which FBAR material may subsequently be deposited, as shown in FIG. 8C.

Figure 8C:
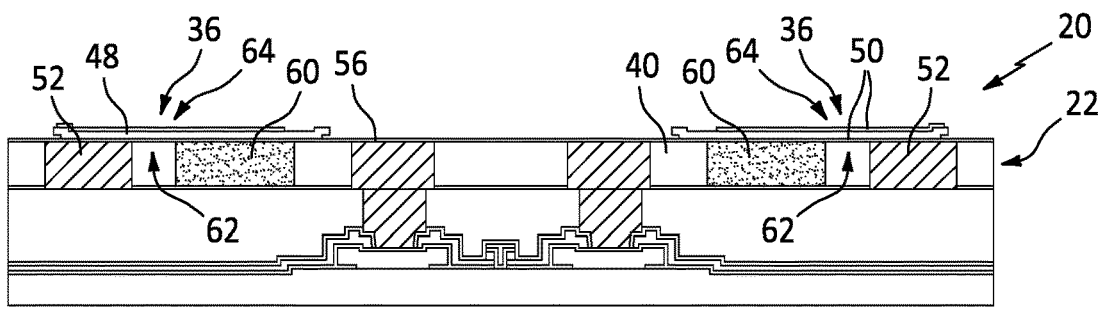
Figure 8D:
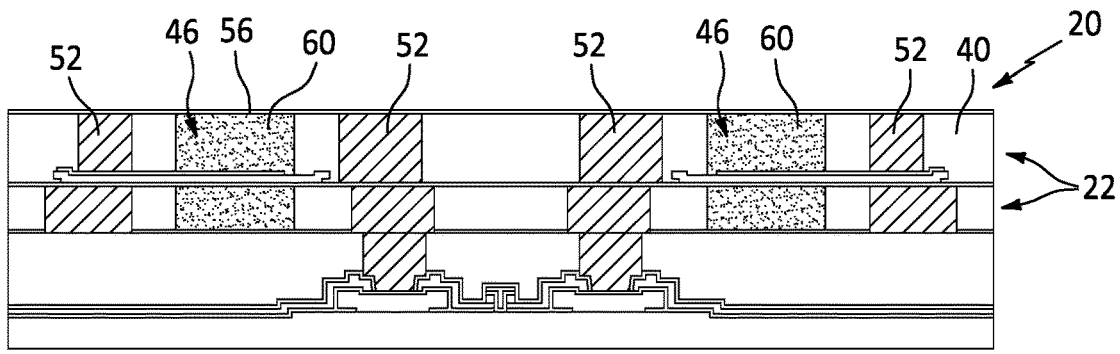
Figure 8E:
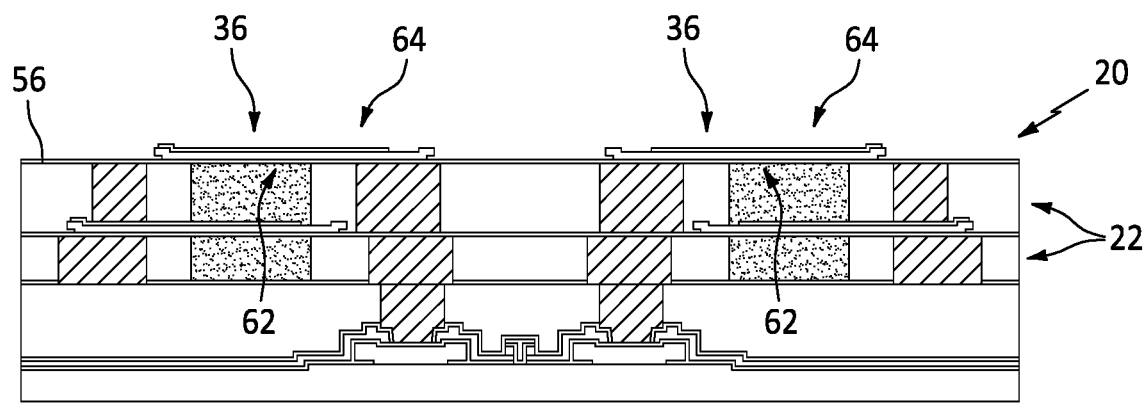
Figure 8F:
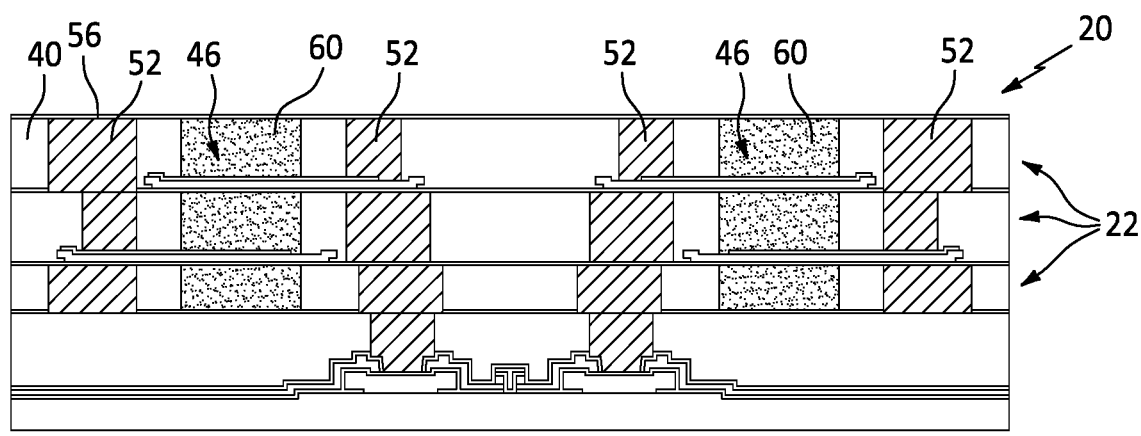
Figure 8G:
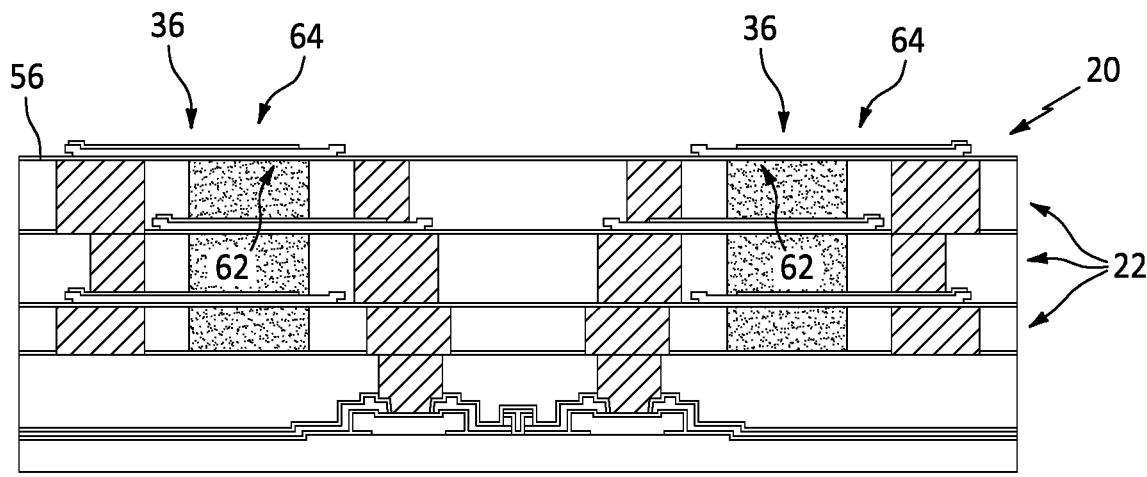

In step 716, a FBAR material stack 64 is deposited within each of the at least one FBAR openings 62 such that the FBAR material stack 64 is deposited on top of a sacrificial material block 60 deposited within a respective FBAR cavity 46 of the resonator layer 22, as shown in FIG. 8C. The FBAR material stack 64 may additionally be deposited in contact with the dielectric layer 40 and/or the conductive layers 52. The FBAR material stack 64 may be deposited, for example, using a CMOS-compatible deposition process. Non-limiting examples of CMOS-compatible deposition processes include, but are not limited to, low-temperature sputter deposition or physical vapor deposition (PVD), low-temperature molecular beam epitaxy (MBE), low-temperature atomic layer deposition (ALD), or other chemical or physical deposition processes than may generally be performed at less than about 350° C. (about 662° F.). However, temperature compatibility for CMOS devices is not limited to 350° C. Higher temperature deposition processes may be acceptable, for example, where the high-temperature process times are kept relatively short. High-temperature deposition processes may generally require shorter process times in order to prevent performance and reliability issues with CMOS devices. As previously discussed with respect to the plurality of FBARs 36, the FBAR material stack 64 may also include the piezoelectric layer 48 and the at least one conductive layer 50. In step 718, the FBAR material stacks 64 for the resonator layer 22 are etched to form the FBARS 36 for the resonator layer 22.

Steps 702-718 may be repeated for each resonator layer 22 as necessary to sequentially fabricate the plurality of vertically-stacked resonator layers 22 for the resonator assembly 20. FIGS. 8D-G illustrate continued fabrication of the plurality of resonator layers 22 at various sequential stages. As the plurality of resonator layers 22 are sequentially fabricated, the sacrificial material block 60 for each FBAR cavity 46 for each resonator layer 22 of the plurality of resonator layers 22 is in contact with a vertically-adjacent sacrificial material block 60 located within a vertically-adjacent resonator layer 22 of the plurality of resonator layers 22. For example, for resonator layers 22 fabricated after an initial resonator layer 22, each sacrificial material block 60 may be deposited, at least in part, onto a vertically-adjacent sacrificial material block 60 from a preceding vertically-adjacent resonator layer 22.

Figure 8H:
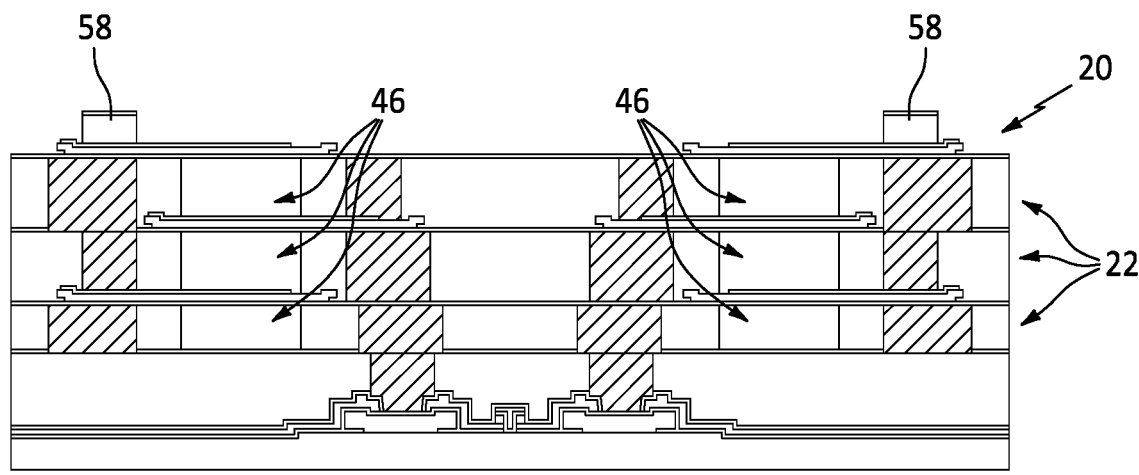

In step 720, the pad out structures 58 for the resonator assembly 20 are fabricated once sequential fabrication of the plurality of resonator layers 22 is complete, as shown in FIG. 8H. The pad out structures 58 may electrically connect to one or more FBARs 36 of the plurality of FBARS 36 to electrically connect the one or more filter networks 38 to an external electrical system or to subsequent layers or other features of the respective IC. The pad out structures 58 may include aluminum (Al), titanium nitride (TiN), or any other suitable conductive material.

In step 722, the sacrificial material block 60 from each FBAR cavity 46 for each resonator layer 22 of the plurality of resonator layers 22 is removed, as shown in FIG. 8H. For example, all of the sacrificial material blocks 60 for the resonator assembly 20 are removed from each FBAR cavity 46 adjacent each FBAR 36 of the plurality of FBARs 36, thereby leaving the plurality of FBARs 36 suspended over respective FBAR cavities 46 of the plurality of FBAR cavities 46 to complete the filter networks 38. Because each of the FBAR cavities 46 of each resonator layer 22 is vertically aligned with one or more FBAR cavities 46 in each vertically-adjacent resonator layer 22 of the plurality of resonator layers 22, as previously discussed, the sacrificial material removal may be conducted for all of the sacrificial material blocks 60 for all of the resonator layers 22 of the plurality of resonator layers 22. Accordingly, aspects of the present disclosure method 700 provide for all of the FBAR cavities 46 to be formed (e.g., by removal of the sacrificial material blocks 60) in a single step. Removal of the sacrificial material blocks 60 from each FBAR cavity 46 may be accomplished, for example, using an etching process. For example, the resonator assembly 20 including the plurality of resonator layers 22 may be exposed to an etching compound such as, but not limited to, xenon difluoride ($XeF_2$), potassium hydroxide (KOH), hot hydrogen peroxide ($H_2O_2$), or oxygen ($O_2$) plasma.

It is noted that various connections are set forth between elements in the preceding description and in the drawings. It is noted that these connections are general and, unless specified otherwise, may be direct or indirect and that this specification is not intended to be limiting in this respect. A coupling between two or more entities may refer to a direct connection or an indirect connection. An indirect connection may incorporate one or more intervening entities. It is further noted that various method or process steps for embodiments of the present disclosure are described in the following description and drawings. The description may present the method and/or process steps as a particular sequence. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the description should not be construed as a limitation.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

While various aspects of the present disclosure have been disclosed, it will be apparent to those of ordinary skill in the art that many more embodiments and implementations are possible within the scope of the present disclosure. For example, the present disclosure as described herein includes several aspects and embodiments that include particular features. Although these particular features may be described individually, it is within the scope of the present disclosure that some or all of these features may be combined with any one of the aspects and remain within the scope of the present disclosure. References to "various embodiments," "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Accordingly, the present disclosure is not to be restricted except in light of the attached claims and their equivalents.

What is claimed is:

1. A method for fabricating a multi-layer resonator assembly, the method comprising:
    sequentially fabricating a plurality of vertically-stacked resonator layers, wherein fabricating each resonator layer of the plurality of resonator layers includes,
        depositing a dielectric layer on an outer dielectric surface;
        forming at least one film bulk acoustic resonator (FBAR) cavity in the deposited dielectric layer;
        filling each FBAR cavity of the at least one FBAR cavity with a sacrificial material block; and
        depositing a FBAR material stack over the at least one FBAR cavity, the deposited FBAR material stack in contact with the sacrificial material block and the dielectric layer; and
    removing the sacrificial material block from the at least one FBAR cavity for each resonator layer of the plurality of resonator layers subsequent to sequentially fabricating the plurality of resonator layers;
    wherein the deposited FBAR material stack of a first of the plurality resonator layer is electrically connected to the deposited FBAR material stack of a second of the plurality of resonator layers forming a filter network.

2. The method of claim 1, wherein the step of filling the at least one FBAR cavity with the sacrificial material block includes depositing the sacrificial material block using one of chemical vapor deposition, physical vapor deposition, or atomic layer deposition.

3. The method of claim 1, wherein the step of removing the sacrificial material block from the at least one FBAR cavity for each resonator layer of the plurality of resonator layers includes exposing the plurality of resonator layers to one of xenon difluoride ($XeF_2$), potassium hydroxide (KOH), hydrogen peroxide ($H_2O_2$), or oxygen ($O_2$) plasma.

4. The method of claim 1, wherein, subsequent to fabricating the plurality of resonator layers and prior to removing the sacrificial material block from the at least one FBAR cavity for each resonator layer of the plurality of resonator layers, the sacrificial material block for the at least one FBAR cavity for each resonator layer of the plurality of resonator layers is in contact with a vertically-adjacent sacrificial material block located within a vertically adjacent resonator layer of the plurality of resonator layers.

5. The method of claim 1, further comprising, for each resonator layer of the plurality of resonator layers, planarizing the dielectric layer and the sacrificial material block within each FBAR cavity of the at least one FBAR cavity subsequent to the step of filling each FBAR cavity of the at least one FBAR cavity with the sacrificial material block.

6. The method of claim 1, further comprising, for each resonator layer of the plurality of resonator layers, forming one or more conductive layers in the dielectric layer.

7. The method of claim 1, further comprising, for each resonator layer of the plurality of resonator layers, depositing a dielectric coating on the dielectric layer and the sacrificial material block within each FBAR cavity of the at least one FBAR cavity subsequent to the step of filling each FBAR cavity of the at least one FBAR cavity with the sacrificial material block and prior to the step of depositing the FBAR material stack over the at least one FBAR cavity.

8. The method of claim 7, further comprising, for each resonator layer of the plurality of resonator layers, removing one or more portions of the dielectric coating prior to the step of depositing the FBAR material stack over the at least one FBAR cavity.

9. The method of claim 1, wherein the deposited FBAR material stack includes a piezoelectric layer and at least one conductive layer.

10. The method of claim 9, wherein the piezoelectric layer is sandwiched between a top conductive layer of the at least one conductive layer and a bottom conductive layer of the at least one conductive layer.

11. The method of claim 1, wherein the sacrificial material block includes one of amorphous silicon, polycrystalline silicon, tungsten, titanium nitride (TiN), or polyimide.

12. A method for fabricating a multi-layer resonator assembly, the method comprising:
sequentially fabricating a plurality of vertically-stacked resonator layers, wherein fabrication for each resonator layer of the plurality of resonator layers includes,
depositing a dielectric layer on a vertically adjacent multi-layer resonator assembly layer, the dielectric layer having a top surface and a bottom surface;
forming at least one film bulk acoustic resonator (FBAR) cavity in the deposited dielectric layer, the at least one FBAR cavity extending from the top surface to the bottom surface and being vertically aligned with a respective FBAR cavity for each vertically adjacent resonator layer of the plurality of resonator layers;
filling each FBAR cavity of the at least one FBAR cavity with a sacrificial material block; and
depositing a FBAR material stack over the at least one FBAR cavity, the deposited FBAR material stack in contact with the sacrificial material block and the dielectric layer; and
removing the sacrificial material block from the at least one FBAR cavity for each resonator layer of the plurality of resonator layers subsequent to sequentially fabricating the plurality of resonator layers.

13. The method of claim 12, wherein the step of filling the at least one FBAR cavity with the sacrificial material block includes depositing the sacrificial material block using one of chemical vapor deposition, physical vapor deposition, or atomic layer deposition.

14. The method of claim 12, wherein, subsequent to fabricating the plurality of resonator layers and prior to removing the sacrificial material block from the at least one FBAR cavity for each resonator layer of the plurality of resonator layers, the sacrificial material block for the at least one FBAR cavity for each resonator layer of the plurality of resonator layers is in contact with a vertically-adjacent sacrificial material block located within a vertically adjacent resonator layer of the plurality of resonator layers.

15. The method of claim 12, further comprising, for each resonator layer of the plurality of resonator layers, planarizing the dielectric layer and the sacrificial material block within each FBAR cavity of the at least one FBAR cavity subsequent to the step of filling each FBAR cavity of the at least one FBAR cavity with the sacrificial material block.

16. The method of claim 12, further comprising, for each resonator layer of the plurality of resonator layers, depositing a dielectric coating on the dielectric layer and the sacrificial material block within each FBAR cavity of the at least one FBAR cavity subsequent to the step of filling each FBAR cavity of the at least one FBAR cavity with the sacrificial material block and prior to the step of depositing the FBAR material stack over the at least one FBAR cavity.

17. The method of claim 16, further comprising, for each resonator layer of the plurality of resonator layers, removing one or more portions of the dielectric coating prior to the step of depositing the FBAR material stack over the at least one FBAR cavity.

18. The method of claim 12, wherein the deposited FBAR material stack includes a piezoelectric layer and at least one conductive layer.

19. A method for fabricating a multi-layer resonator assembly, the method comprising:
sequentially fabricating a plurality of vertically-stacked resonator layers, wherein fabricating each resonator layer of the plurality of resonator layers includes:
depositing a dielectric layer on a top surface of a lower dielectric layer;
forming a film bulk acoustic resonator (FBAR) cavity in the deposited dielectric layer;
filling the FBAR cavity with a sacrificial material block; and
depositing a FBAR material stack over the FBAR cavity, the deposited FBAR material stack in contact with the sacrificial material block and the dielectric layer; and
removing the sacrificial material block from the FBAR cavity for each resonator layer of the plurality of resonator layers subsequent to sequentially fabricating the plurality of resonator layers, and the deposited FBAR material stack for each resonator layer of the plurality of resonator layers forming a plurality of FBAR material stacks;
wherein the plurality of FBAR material stacks are electrically connected to form a filter network, the filter network configured as a three-dimensional array of FBAR material stacks.

* * * * *